(12) United States Patent
Kashiwakura

(10) Patent No.: US 9,166,560 B2
(45) Date of Patent: Oct. 20, 2015

(54) DECOUPLING CIRCUIT AND SEMICONDUCTOR INTEGRATED CIRCUIT

(71) Applicant: NEC Corporation, Minato-ku, Tokyo (JP)

(72) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/353,596

(22) PCT Filed: Nov. 14, 2012

(86) PCT No.: PCT/JP2012/079545
§ 371 (c)(1),
(2) Date: Apr. 23, 2014

(87) PCT Pub. No.: WO2013/073591
PCT Pub. Date: May 23, 2013

(65) Prior Publication Data
US 2014/0292399 A1 Oct. 2, 2014

(30) Foreign Application Priority Data
Nov. 14, 2011 (JP) ................. 2011-248276

(51) Int. Cl.
| H03B 1/00 | (2006.01) |
| H03H 11/04 | (2006.01) |
| H01L 27/06 | (2006.01) |
| H03K 3/013 | (2006.01) |
| H01L 23/50 | (2006.01) |
| H01L 23/64 | (2006.01) |

(52) U.S. Cl.
CPC ....... *H03H 11/0405* (2013.01); *H01L 27/0629* (2013.01); *H03K 3/013* (2013.01); *H01L 23/50* (2013.01); *H01L 23/642* (2013.01); *H01L 2224/16* (2013.01); *H01L 2924/13091* (2013.01); *H01L 2924/15311* (2013.01)

(58) Field of Classification Search
CPC ...... G05F 1/467; H03K 17/16; H03K 17/161; H03K 17/162; H03K 19/00346; H03K 19/00361
USPC .......................................... 327/379, 384, 545
See application file for complete search history.

(56) References Cited

U.S. PATENT DOCUMENTS

| 5,376,843 | A | * | 12/1994 | Tien et al. ........................ 326/68 |
| 5,828,259 | A | * | 10/1998 | Cases et al. .................... 327/376 |
| 6,057,729 | A | * | 5/2000 | Nomura ......................... 327/592 |
| 6,191,628 | B1 | * | 2/2001 | Bernstein et al. ............. 327/170 |
| 7,199,490 | B2 | * | 4/2007 | Nomura ......................... 307/115 |
| 7,292,421 | B2 | * | 11/2007 | Smith .............................. 361/56 |
| 2006/0017144 | A1 | | 1/2006 | Uematsu et al. |
| 2006/0103994 | A1 | | 5/2006 | Smith |

FOREIGN PATENT DOCUMENTS

JP  2003-86699 A  3/2003
JP  2006-32823 A  2/2006
(Continued)

OTHER PUBLICATIONS

International Search Report for PCT Application No. PCT/JP2012/079545, mailed on Dec. 25, 2012.

*Primary Examiner* — Jeffrey Zweizig

(57) ABSTRACT

A decoupling circuit comprises an output buffer that includes a transistor, and a capacitor that has an end thereof connected to an output node of the output buffer and the other end thereof connected to a power supply line, and a logic level outputted by the output node of the output buffer is fixed.

4 Claims, 18 Drawing Sheets

(56) References Cited

FOREIGN PATENT DOCUMENTS

| | | | |
|---|---|---|---|
| JP | 2006-295027 A | 10/2006 |
| JP | 2006-304346 A | 11/2006 |
| JP | 2008-520109 A | 6/2008 |
| JP | 2010-62304 A | 3/2010 |
| JP | 2011-9291 A | 1/2011 |
| JP | 2011-124615 A | 6/2011 |

* cited by examiner

DECOUPLING CIRCUIT AND SEMICONDUCTOR INTEGRATED CIRCUIT

TECHNICAL FIELD

The present invention is based upon and claims the benefit of the priority of Japanese patent application No. 2011-248276 filed on Nov. 14, 2011, the disclosure of which is incorporated herein in its entirety by reference thereto.

The present invention relates to a decoupling circuit and semiconductor integrated circuit comprising a decoupling circuit.

BACKGROUND

Operating frequencies of semiconductor integrated circuits are steadily increasing. Meanwhile, power supply voltages supplied to semiconductor integrated circuits are decreasing every year in order to increase the operating frequencies of the semiconductor integrated circuits. Further, when the operating frequency of a semiconductor integrated circuit increases, problems such as noise and electromagnetic interference occur inside and outside of the semiconductor integrated circuit.

Patent Literature [PTL] 1 discloses a semiconductor device that suppresses noise and a leakage signal transmitted through a power line according to a change in the operating frequency or ambient circumstances by varying the capacitance value of a bypass capacitor provided so as to prevent interference to the semiconductor device having a plurality of circuit blocks. In the semiconductor device disclosed in Patent Literature 1, transistors that function as switches are added in order to switch the capacitance of the bypass capacitor.

Further, Patent Literature 2 discloses a technology that solves the issue of electromagnetic interference by providing a bypass capacitor in a semiconductor integrated circuit and having a transistor connected to the bypass capacitor operate as a switch. Therefore, the semiconductor integrated circuit disclosed in Patent Literature 2 has a transistor that functions as a switch added in order to switch the capacitance of a bypass capacitor as well.

Further, Patent Literature 3 discloses a technology that provides a capacitive element in a semiconductor integrated circuit and utilizes it as a bypass capacitor using a transistor.

CITATION LIST

Patent Literature

[PTL 1]
Japanese Patent Kokai Publication No. JP-P2006-295027A
[PTL 2]
Japanese Patent Kokai Publication No. JP-P2011-009291A
[PTL 3]
Japanese Patent Kokai Publication No. JP-P2010-062304A

SUMMARY

Technical Problem

The each disclosure of Patent Literatures listed above is incorporated herein in its entirety by reference thereto. The following analysis is performed from the standpoint of the present invention.

In many cases, a semiconductor integrated circuit transmits a signal to another semiconductor integrated circuit via an output buffer. When an internal impedance of the semiconductor integrated circuit including a power feed circuit that supplies power to this output buffer is high, a power supply capability of the power feed circuit decreases. A decrease in the power supply capability in the power feed circuit translates into a change in the power supply voltage, i.e., a noise occurrence. Further, with the recent increases in the operating frequencies of semiconductor integrated circuits, the peaks of the operating frequencies and internal impedance have become closer and the impact of the noise described above has increased.

FIG. 2 is an example of a schematic drawing of components of a semiconductor integrated circuit and a power feed circuit. The semiconductor integrated circuit shown in FIG. 2 includes a printed circuit board 10, an interposer 11, a die 12, and a pad (electrode pad) 13 as the components. In FIG. 2, equivalent circuits of these components are indicated by regions surrounded by dotted lines. Details of these equivalent circuits are described later.

In the semiconductor integrated circuit shown in FIG. 2, a power line 14 and a ground line 15 wired on the printed circuit board 10 supply power via the pad 13 and a solder ball 16. Further, power is supplied to the die 12 via the interposer 11 and a solder ball 17 of a flip chip. Note that FIG. 2 shows a flip chip, but power is supplied similarly in connection using wire bonding (via the same power path).

FIG. 3 is a drawing showing an example of a circuit diagram in which only the equivalent circuits shown in FIG. 2 are extracted. As shown in FIG. 3, a power supply voltage is supplied to the die 12 via a power supply 20, the equivalent circuits 21 and 23 of decoupling capacitors 18 and 19, the equivalent circuits 22 and 24 of the printed circuit board 10, and the equivalent circuit 26 of the interposer 11.

The die 12 includes an output buffer 28, and information transmission (logic transmission) is carried out by flowing a current to the outside of the semiconductor integrated circuit via the output buffer 28 of the die 12. At the time of information transmission, repeatedly turning the output buffer 28 on and off causes a current to flow in the power feed circuit, and a voltage change, i.e., noise, caused by an impedance of the power feed circuit network occurs. Therefore, in order to suppress such noise, the impedance of the power feed circuit must be reduced.

Here, the impedance of the power feed circuit network from an observation point in FIG. 3 is calculated. FIG. 4 is a drawing showing an example of impedance calculation (simulation) in a hypothetical particular semiconductor integrated circuit. In FIG. 4, a peak of the impedance is recognized around a point A. An example of the frequency of the point A can be a relatively high frequency, around 100 MHz. Therefore, when a frequency used for the information transmission of the semiconductor integrated circuit is near the peak of the impedance, there occurs a problem that the noise and the impact thereof increase.

Further, the technologies disclosed in Patent Literatures 1 and 2 reduce the impact of noise and electromagnetic interference by changing the resonant frequency, but do not decrease the internal impedance of the semiconductor integrated circuits. In the technologies disclosed in Patent Literatures 1 to 3, transistors are added for switching the bypass capacitors, resulting in a problem that the chip size and cost of the semiconductor integrated circuits increase. Therefore, a decoupling circuit and semiconductor integrated circuit that reduce the internal impedance without having a new transistor added are desired.

Solution to Problem

According to a first aspect of the present invention, there is provided a decoupling circuit comprising an output buffer that includes a transistor, and a capacitor that has an end thereof connected to an output node of the output buffer and the other end thereof connected to a power supply line; and a logic level outputted by the output node of the output buffer is fixed.

According to a second aspect of the present invention, there is provided a semiconductor integrated circuit comprising a plurality of output buffers that include a transistor, and a capacitor that has an end thereof connected to an output node of an unused buffer that does not contribute to an operation of transmitting a signal to outside among the plurality of output buffers, and the other end thereof connected to a power supply line; and a logic level outputted by the output node of the unused buffer is fixed.

Advantageous Effects of Invention

According to each aspect of the present invention, there are provided a decoupling circuit and semiconductor integrated circuit that reduce the internal impedance without having a new transistor added.

MODES FOR CARRYING OUT THE INVENTION

First, a summary of an exemplary embodiment will be given using FIG. 1. Note that drawing reference signs in the summary are given to each element for convenience as examples solely for facilitating understanding and the descriptions in the summary are not intended to limit the present invention.

As described above, when the operating frequency of a semiconductor integrated circuit is near the peak of the impedance, the impact of noise increases. Further, if a transistor for switching a bypass capacitor is added to solve such a problem, the chip size and cost of the semiconductor integrated circuit will increase. Therefore, a decoupling circuit that reduces the internal impedance without having a new transistor added is desired.

Figure 1:
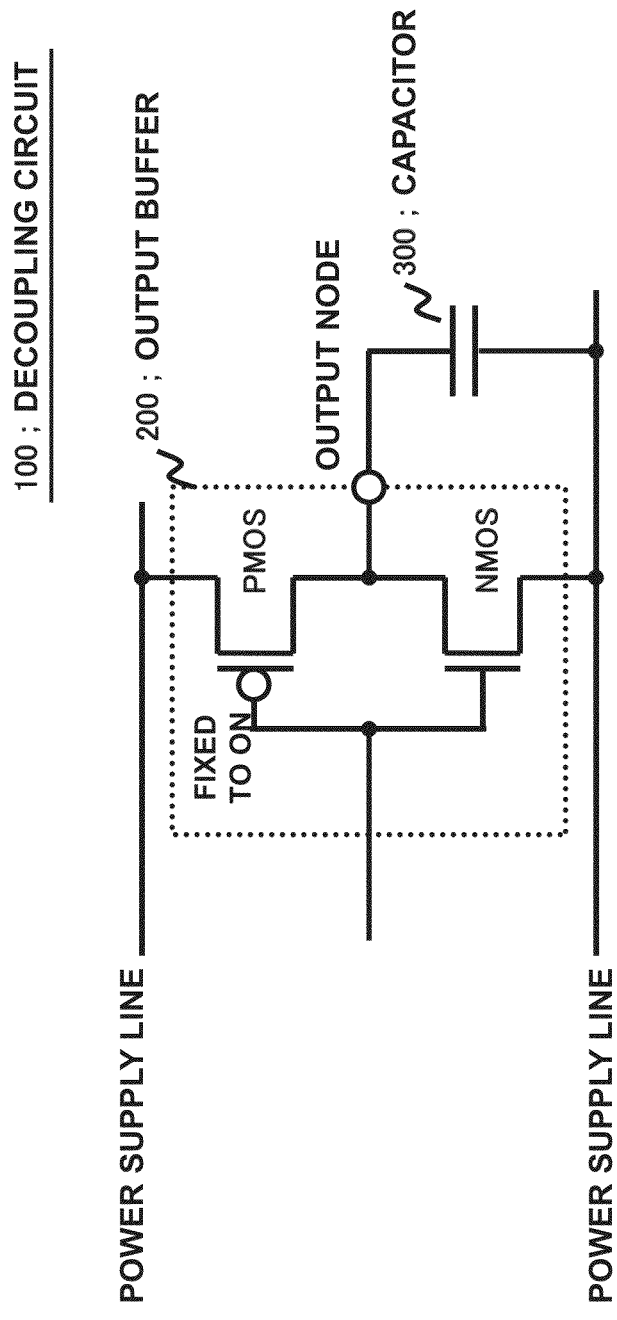
FIG. 1 is a drawing for explaining a summary of an exemplary embodiment.
Figure 2:
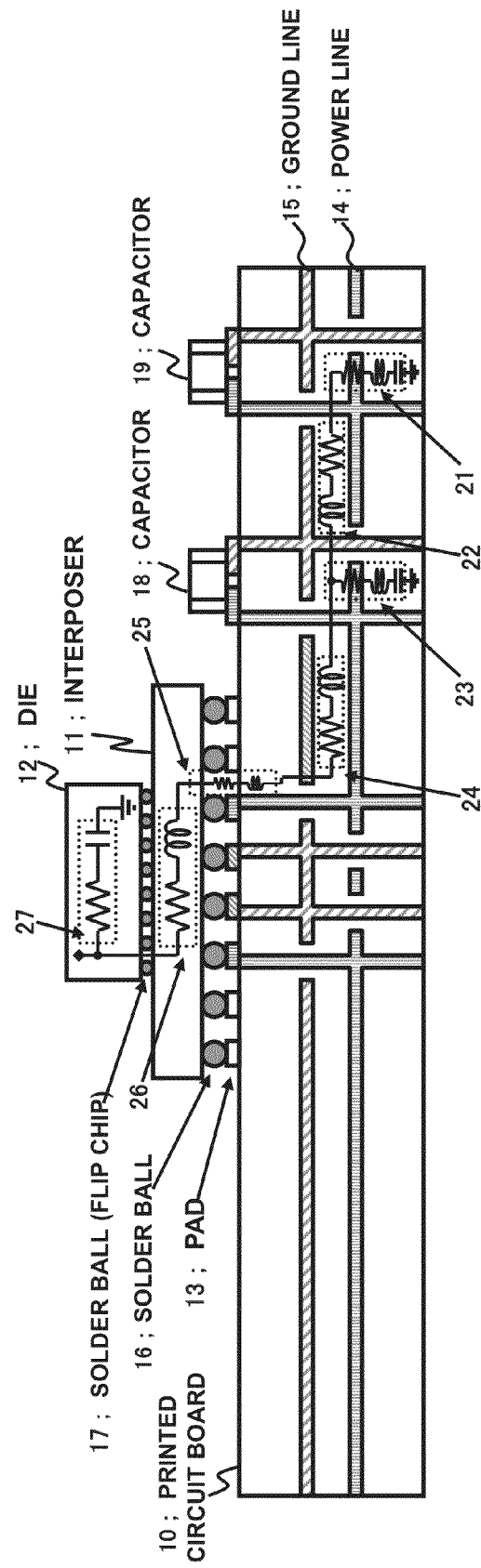
FIG. 2 is an example of a schematic diagram of components of a semiconductor integrated circuit and a power feed circuit.

As an example, a decoupling circuit 100 shown in FIG. 1 is provided. The decoupling circuit 100 shown in FIG. 1 comprises an output buffer 200 including a transistor, and a capacitor 300 having an end thereof connected to an output node of the output buffer 200 and the other end connected to a power supply line, and a logic level outputted by the output node of the output buffer 200 is fixed.

Here, the study by the inventor discovered the fact that the internal impedance of a semiconductor integrated circuit (or a die thereof) can be reduced if an RC circuit is added as the decoupling circuit 100. The reason why the addition of the RC circuit reduces the internal impedance will be described later.

Meanwhile, a semiconductor integrated circuit comprising an output buffer often includes an unused buffer, and by having a transistor of the output buffer constantly output the same logic level (H level or L level), the on-resistance of the transistor can be obtained. In the decoupling circuit 100 shown in FIG. 1, this on-resistance and the capacitor 300 constitute the RC circuit, thereby reducing the internal impedance. As a result, a decoupling circuit that reduces the internal impedance without having a new transistor added can be provided.

Further, the following modes are possible.

Mode 1

The decoupling circuit relating to the first aspect.

Mode 2

It is preferred that the output buffer be formed of a MOS transistor of a first conductivity type and a MOS transistor of a second conductivity type.

Mode 3

It is preferred that the MOS transistor of the first conductivity type be a P-channel MOS transistor, the MOS transistor of the second conductivity type be an N-channel MOS transistor, the P-channel MOS transistor be put in an ON state when the capacitor is connected to a ground voltage, and the N-channel MOS transistor be put in an ON state when the capacitor is connected to a power supply voltage.

Mode 4

The semiconductor integrated circuit relating to the second aspect.

A concrete exemplary embodiment will be described in detail below with reference to the drawings.

Exemplary Embodiment 1

A first exemplary embodiment will be described further in detail with reference to the drawings.

Figure 5:
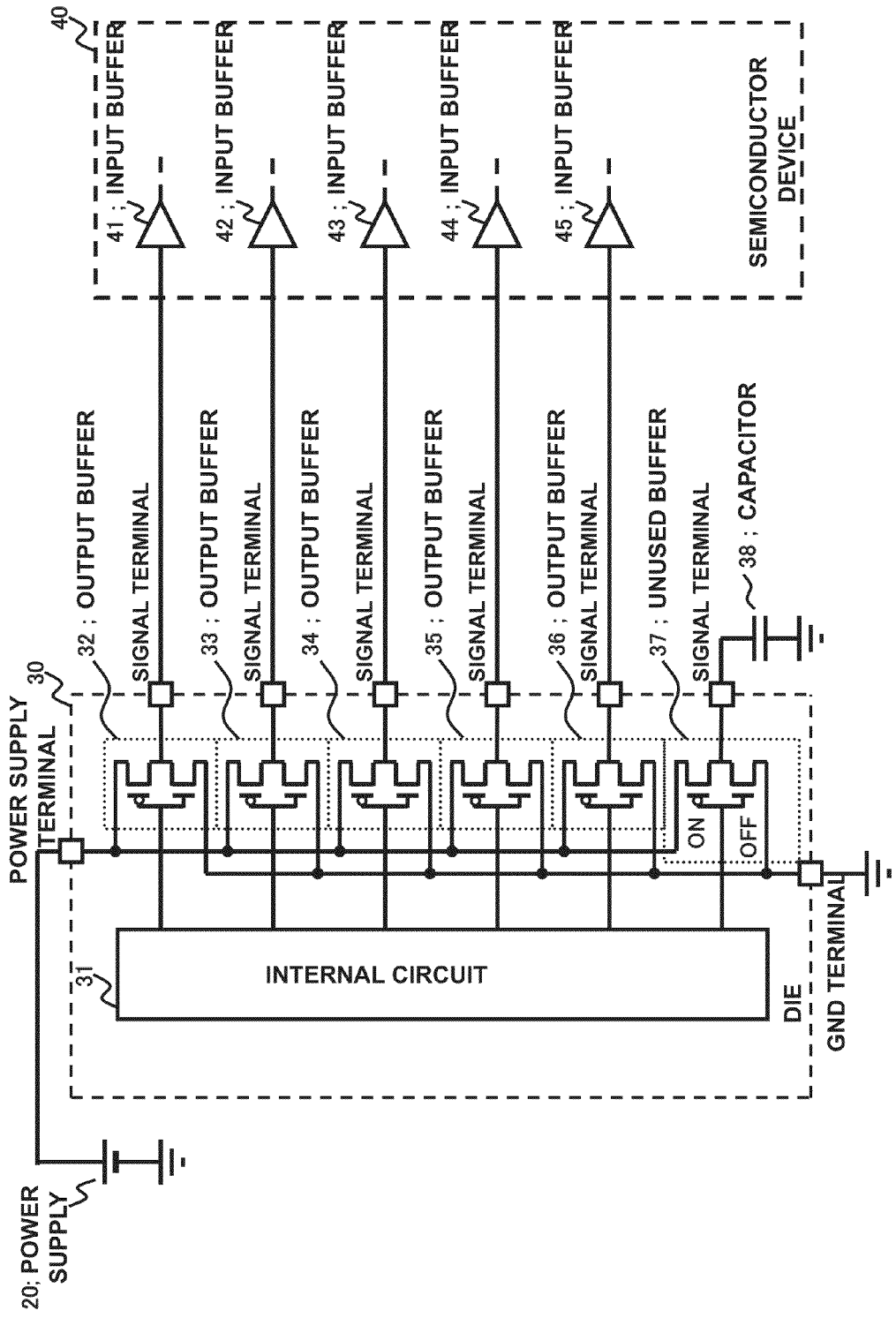
FIG. 5 is a drawing showing an example of a circuit configuration of a die 30 in a semiconductor integrated circuit relating to a first exemplary embodiment.

FIG. 5 is a drawing showing an example of a circuit configuration of a die 30 in a semiconductor integrated circuit relating to the present exemplary embodiment. Note that FIG. 5 only shows components necessary for the present exemplary embodiment for the sake of simplicity (bypass capacitors, etc., are omitted).

The die 30 receives power supply from a power supply 20 via a power supply terminal and ground terminal. Further, the die 30 (the semiconductor integrated circuit that includes the die 30) is connected to a semiconductor device 40, and the die 30 is able to transmit information to the semiconductor device 40. More concretely, an internal circuit 31 included in the die 30 generates data to be transmitted, and signals are outputted via output buffers 32 to 36.

Input buffers 41 to 45 included in the semiconductor device 40 receive the data outputted by the die 30. Further, the die 30 includes an output buffer (described as "unused buffer 37" in FIG. 5) not connected to the semiconductor device 40. This unused buffer 37 and a capacitor 38 constitute a decoupling circuit. The output buffers 32 to 36 and the unused buffer 37 are formed of P-channel MOS transistors and N-channel MOS transistors. Further, there is no structural difference between the output buffers 32 to 36 and the unused buffer 37.

As described above, the decoupling circuit includes the unused buffer 37, an output node of the unused buffer 37 is connected to an end of an electrode of the capacitor 38, and the other end is grounded. Further, the internal circuit 31 outputs signals in such a manner that an H level is outputted from the unused buffer 37 (the P-channel MOS transistor is turned on).

As described, the power supply 20 that supplies power to the die 30 is connected to the capacitor 38 via the P-channel MOS transistor of the unused buffer 37.

Next, equivalent circuits of the die 30 and the decoupling circuit will be described.

Figure 6:
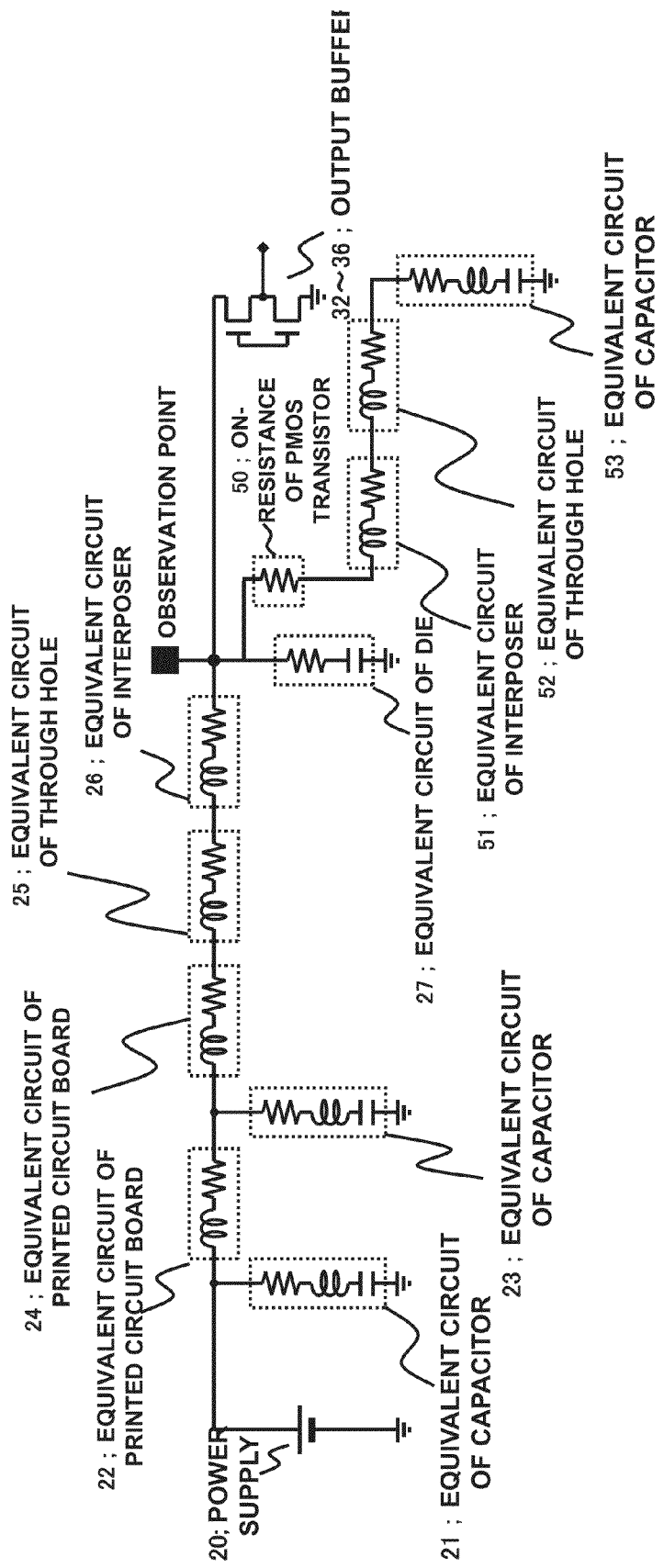
FIG. 6 is a drawing showing an example of equivalent circuits from a power supply 20 to output buffers shown in FIG. 5.

FIG. 6 is a drawing showing an example of equivalent circuits of the power supply 20, the output buffers 32 to 36, and the unused buffer 37. In FIG. 6, the same signs are given to the components same as those in FIG. 3, and the explanation will be omitted.

Figure 3:
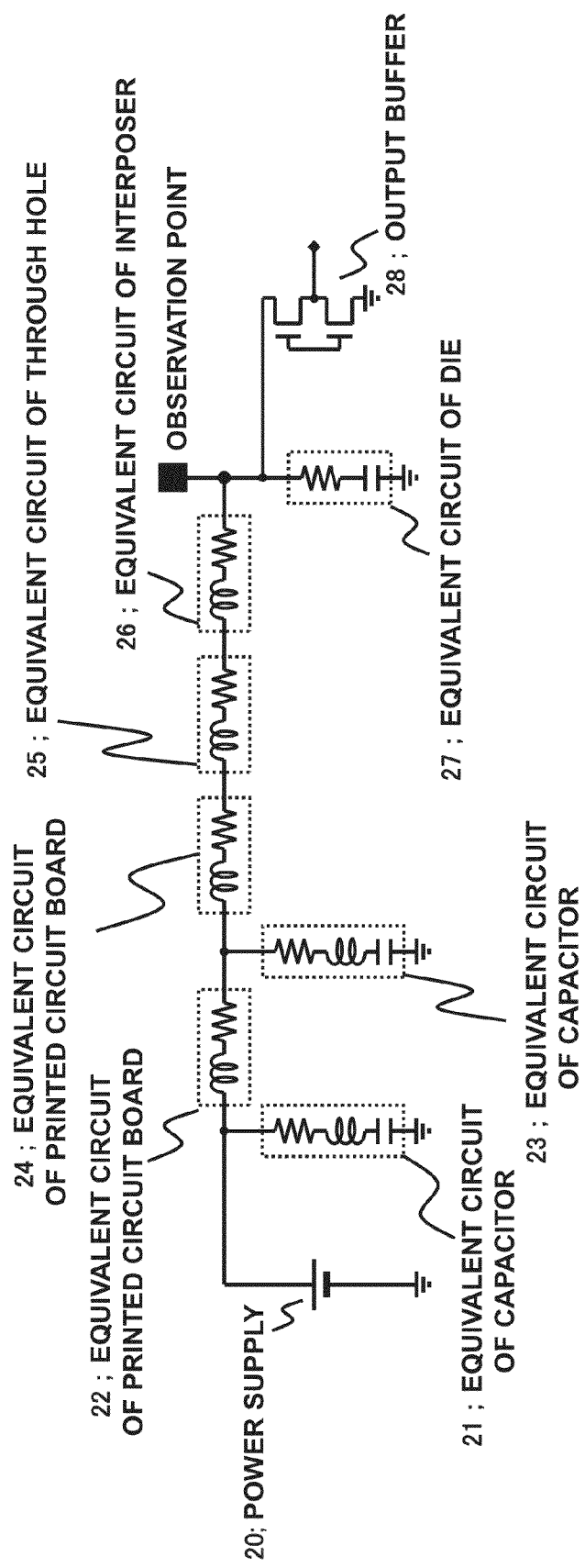
FIG. 3 is a drawing showing an example of a circuit diagram in which equivalent circuits shown in FIG. 2 are extracted.

In FIG. 6, on-resistance 50 of the P-channel MOS transistor, an equivalent circuit 51 of an interposer, an equivalent circuit 52 of a through hole, and an equivalent circuit 53 of the capacitor 38 are added to the components in FIG. 3.

Here, the impedance from an observation point in FIG. 6 is calculated.

Figure 4:
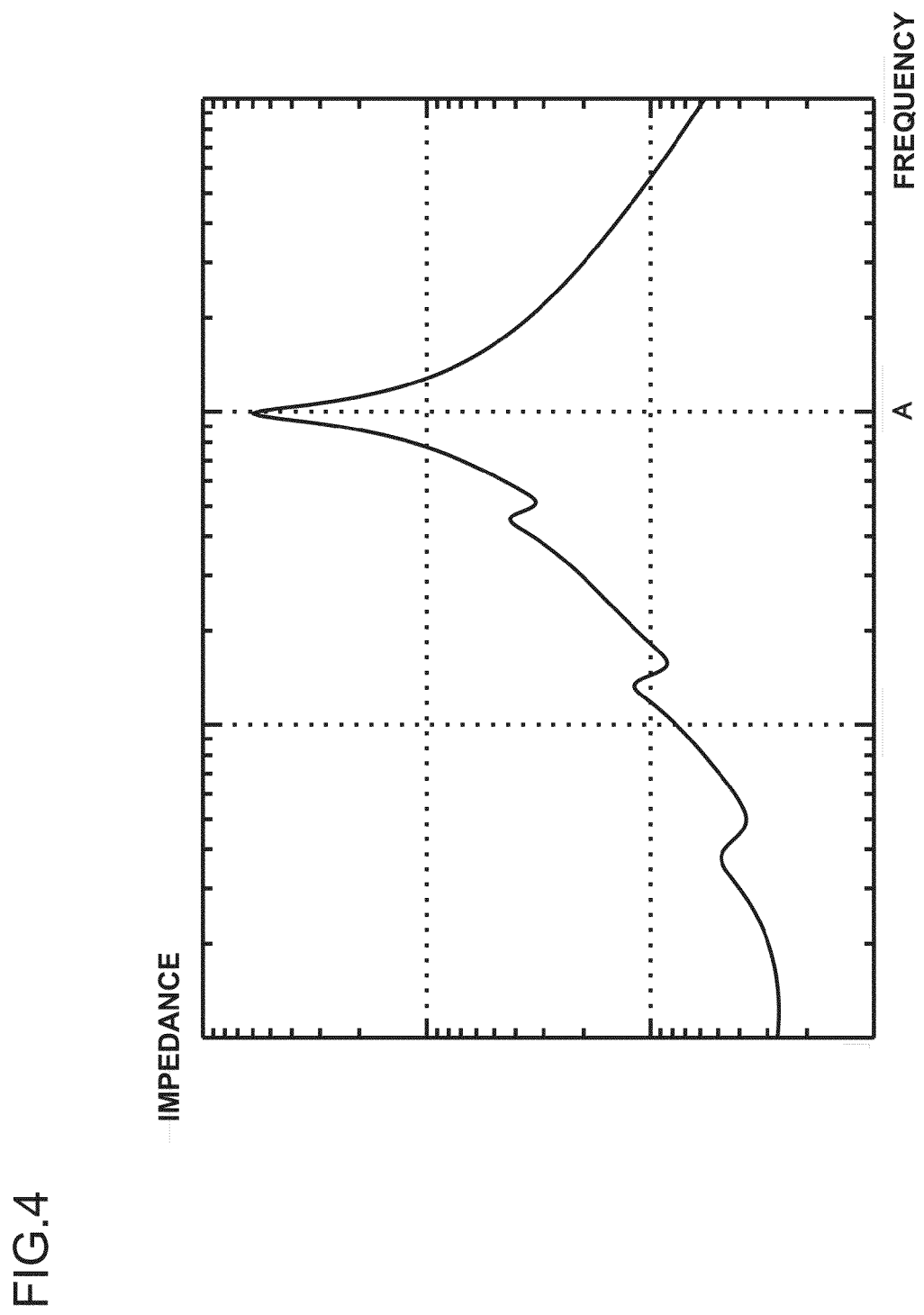
FIG. 4 is a drawing showing an example of impedance calculation in a hypothetical particular semiconductor integrated circuit.
Figure 7:
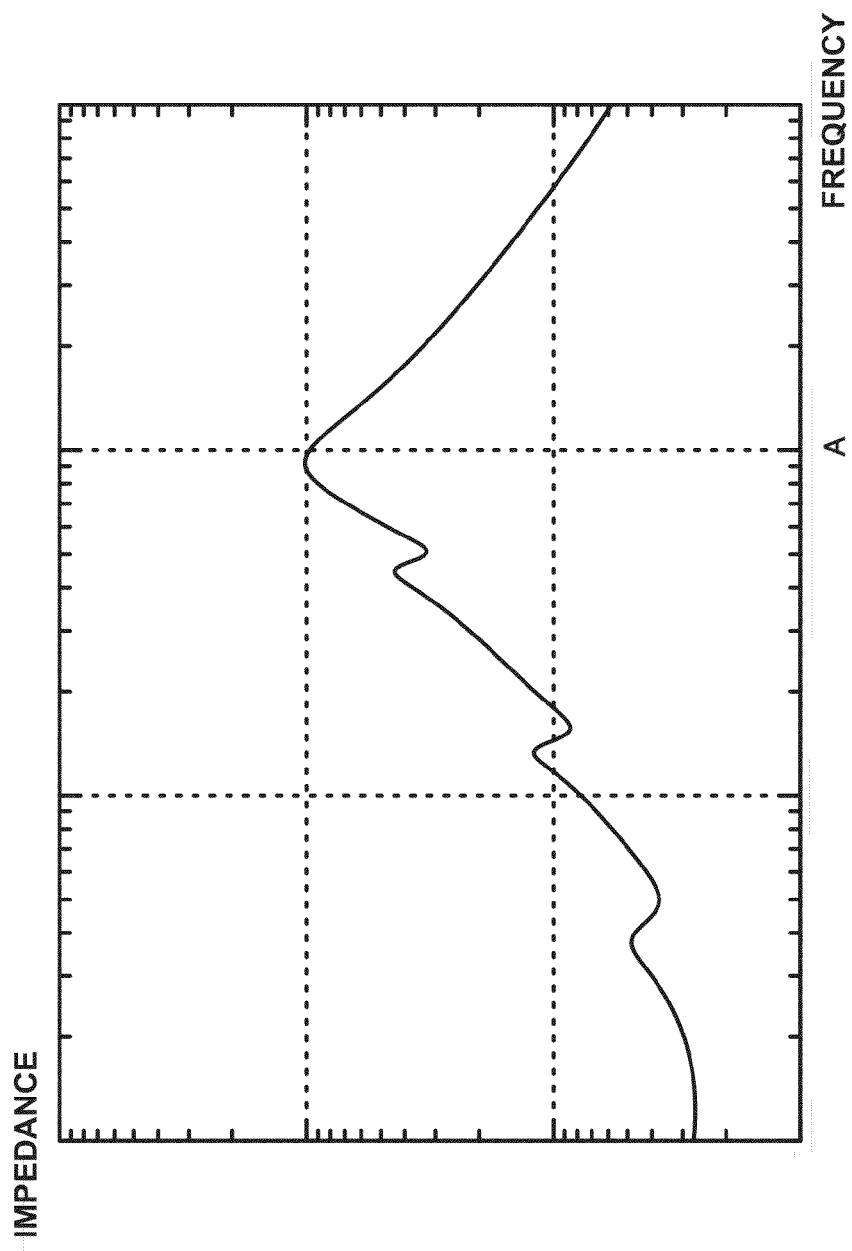
FIG. 7 is a drawing showing an example of impedance calculation.

FIG. 7 is a drawing showing an example of the impedance calculation. By comparing FIG. 7 to FIG. 4, one can see that the impedance near the point A is reduced.

Next, the reason why adding an RC circuit like the decoupling circuit shown in FIG. 5 can reduce impedance will be explained.

Figure 8A:
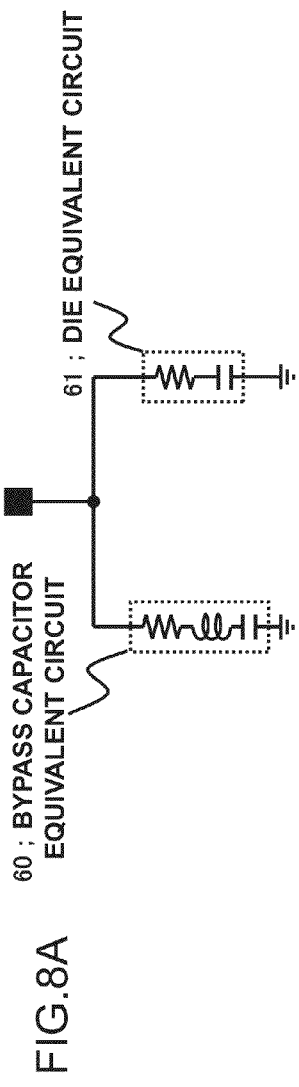
FIGS. 8A, 8B, and 8C are drawings for explaining how an RC circuit can reduce impedance.
Figure 8B:
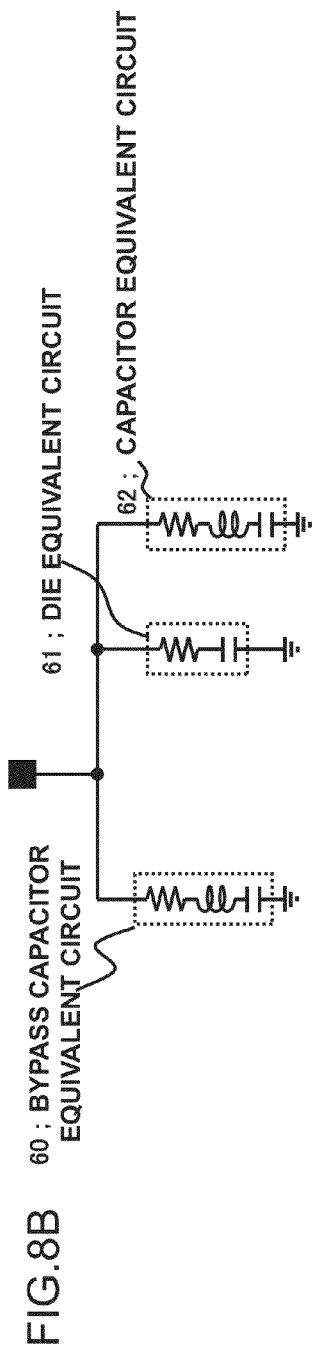
Figure 8C:
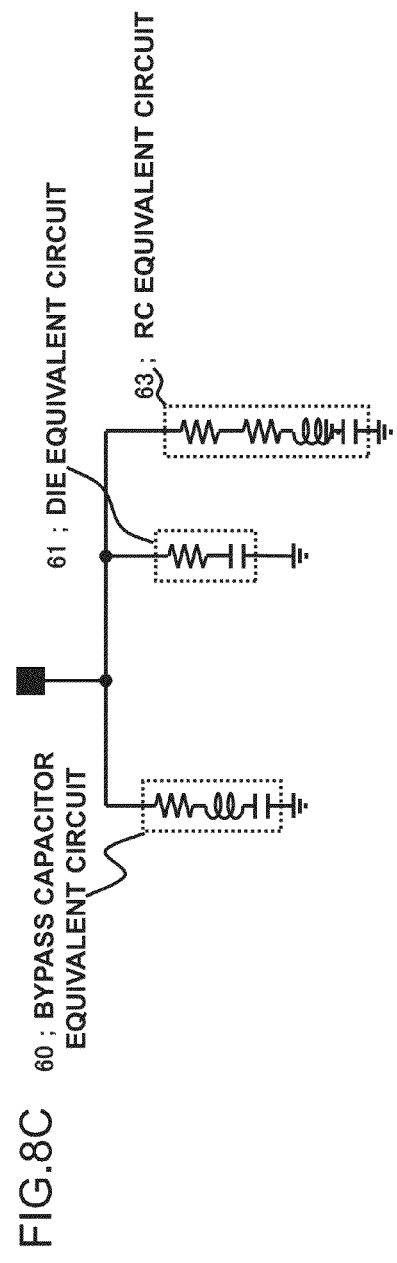

FIGS. 8A, 8B, and 8C are drawings for explaining that an RC circuit can reduce impedance. FIG. 8A is a drawing showing equivalent circuits without any decoupling circuit added. FIG. 8B is a drawing showing equivalent circuits with a capacitor added as a decoupling circuit. FIG. 8C is a drawing showing equivalent circuits with a resistor and capacitor added as a decoupling circuit. FIGS. 8A, 8B, and 8C all include a bypass capacitor equivalent circuit 60 in which a bypass capacitor is modeled and a die equivalent circuit 61.

First, the impedance of an equivalent circuit in which a capacitor is added as a bypass capacitor to a die will be calculated (FIG. 8A).

Figure 9:
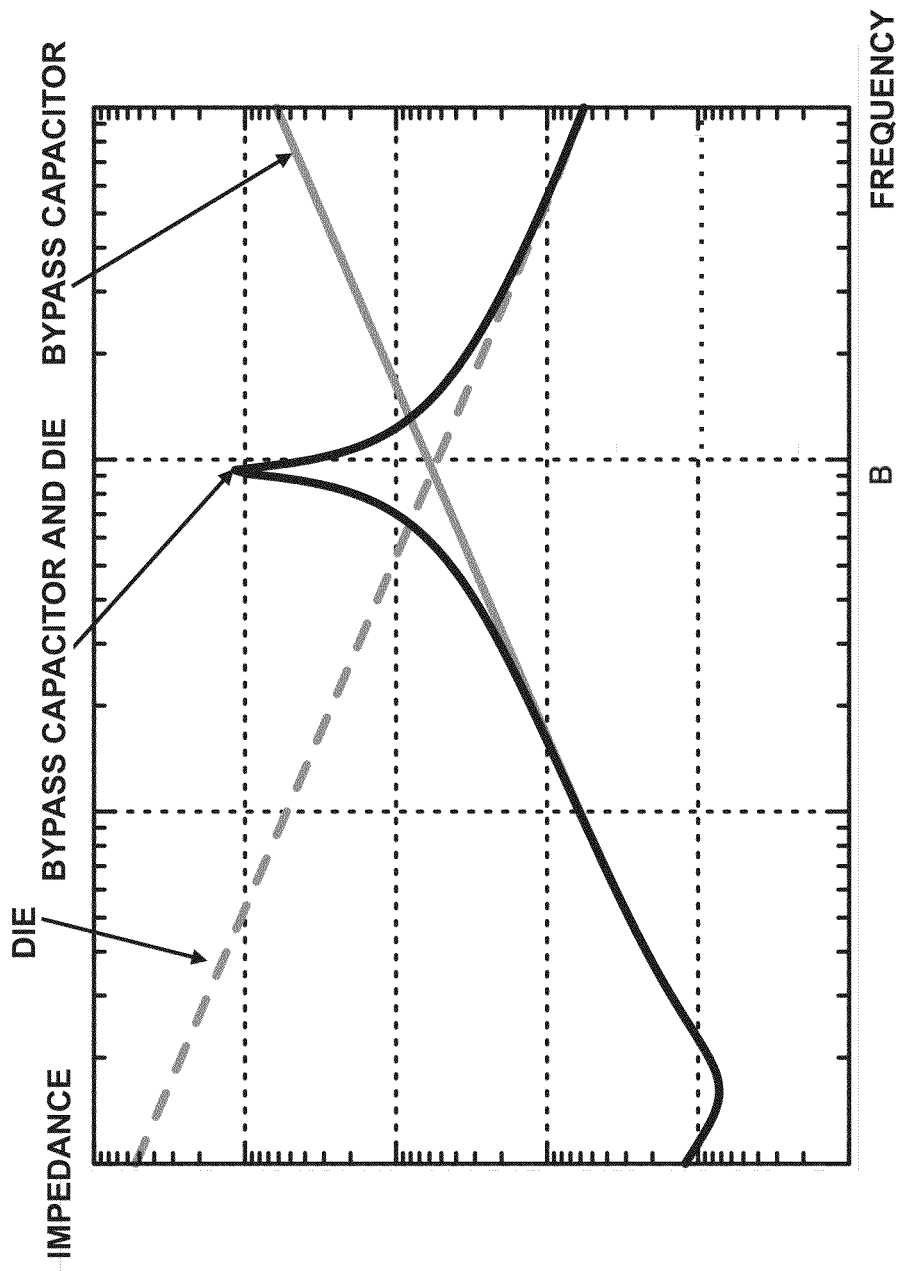
FIG. 9 is a drawing showing an example of impedance calculation for an equivalent circuit shown in FIG. 8A.

FIG. 9 is a drawing showing an example of calculating the impedance in FIG. 8A. FIG. 9 shows that a frequency response of the impedance in the bypass capacitor equivalent circuit 60 soars at an intersection B. This indicates that the frequency response of the bypass capacitor equivalent circuit 60 at the intersection B can be treated like the characteristics of $j\omega L$ (j: imaginary unit; $\omega$: angular frequency; L: inductance) and that the inductance component is dominant (inductive).

Meanwhile, a frequency response of the die equivalent circuit 61 decreases at the intersection B and can be treated like the characteristics of $1/j\omega C$ (C: capacitance), indicating that the capacitor component is dominant (capacitive).

Therefore, the equivalent circuits shown in FIG. 8A can be seen as an inductor and a capacitor connected in parallel. When an inductor and a capacitor are connected in parallel and $j\omega L$ is equal to $1/j\omega C$, parallel resonance (anti-resonance) occurs and the impedance increases at the resonant frequency. This is the reason why the internal impedance increases in a semiconductor integrated circuit.

As a method for reducing the increased impedance, a bypass capacitor can be added. FIG. 8B is the result of adding the capacitor equivalent circuit 62 to the equivalent circuits in FIG. 8A.

Figure 10:
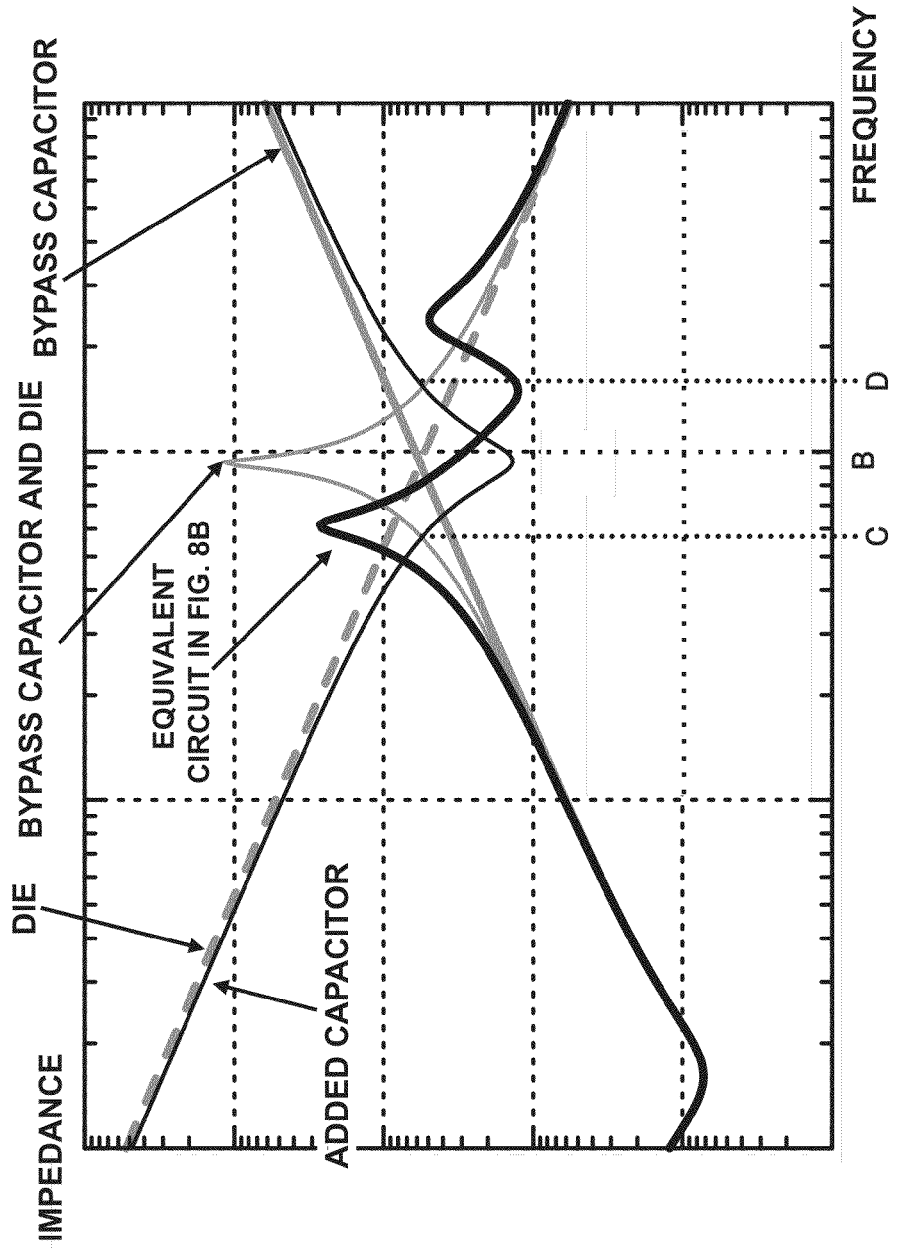
FIG. 10 is a drawing showing an example of impedance calculation for an equivalent circuit shown in FIG. 8B.

FIG. 10 is a drawing showing an example of calculating the impedance in FIG. 8B. Here, a capacitance of the capacitor added to FIG. 8A is selected according to the peak frequency of the impedance (the point B in FIG. 9). The peak of the impedance in the equivalent circuits in FIG. 8A can be reduced by appropriately selecting the capacitance of the added capacitor, but another peak will occur. The reason is that connecting the added capacitor in parallel with the bypass capacitor equivalent circuit 60 and the die equivalent circuit 61 creates two different intersections, each of which will cause a parallel resonance.

More concretely, the added capacitor shows decreasing characteristics (capacitive) at an intersection C in FIG. 10 and shows increasing characteristics (inductive) at an intersection D in FIG. 10. As a result, two peaks (increases in the impedance) occur.

Therefore, as shown in FIG. 8C, an RC circuit (sign 63 denotes the equivalent circuit thereof) is added, instead of adding a capacitor.

Figure 11:
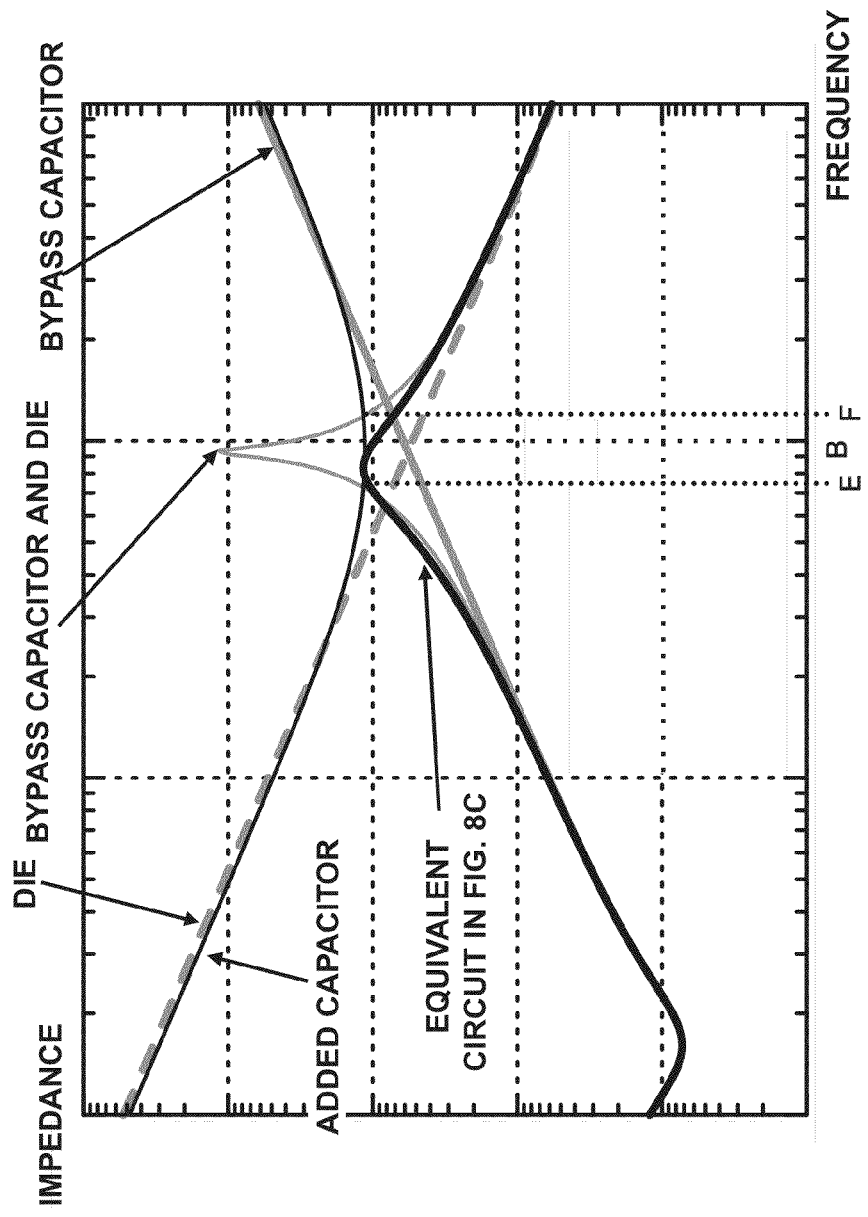
FIG. 11 is a drawing showing an example of impedance calculation for an equivalent circuit shown in FIG. 8C.

FIG. 11 is a drawing showing an example of calculating the impedance in FIG. 8C. Adding the RC circuit can reduce the peaks of the impedance in FIG. 8A. As shown in FIG. 11, even in the case where the RC circuit is added, two intersections E and F exist between the frequency response of the impedance of the bypass capacitor equivalent circuit 60 and the die equivalent circuit 61 and the frequency response of the impedance of the added RC circuit.

However, unlike the case where a capacitor is simply added (FIG. 10), the characteristics of the added RC circuit are flat at the intersections E and F, independent of the frequency. Since the impedance is flat against the frequency, characteristics of a resistance is shown. Therefore, the intersection E corresponds to a parallel connection of an inductor and a resistor, and the intersection F corresponds to a parallel connection of a capacitor and a resistor. As a result, the impedance can be reduced, unlike in an LC resonant connection where the impedance increases. The above is the explanation as to how adding an RC circuit can reduce impedance.

Next, the output buffers 32 to 36 and the unused buffer 37 included in the die 30 will be described.

Figure 12A:
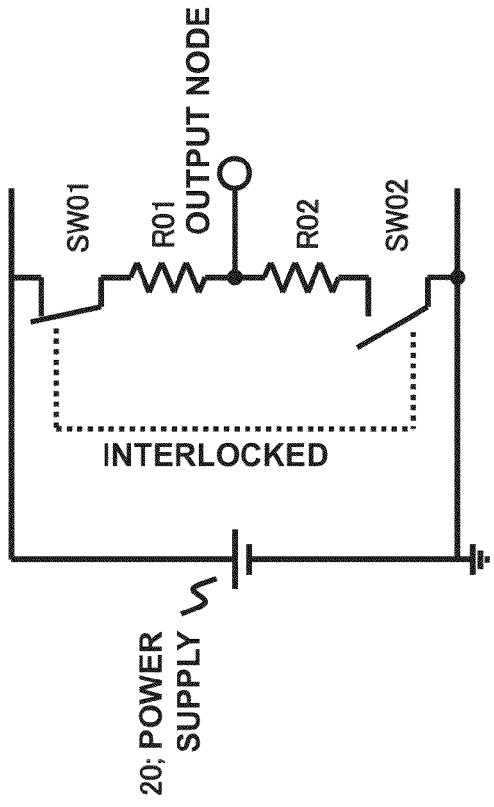
FIGS. 12A and 12B are drawings showing an example of a circuit configuration and an equivalent circuit of an unused buffer 37.
Figure 12B:
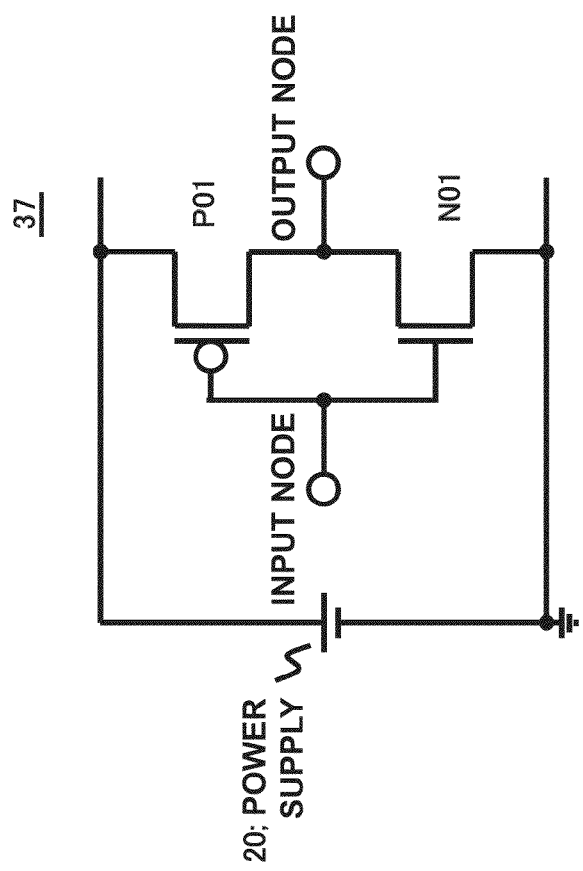

FIGS. 12A and 12B are drawings showing an example of a circuit configuration and an equivalent circuit of the unused buffer 37. Note that the output buffers 32 to 36 are configured identically to FIGS. 12A and 12B. The unused buffer 37 is formed of a P-channel MOS transistor P01 and an N-channel MOS transistor N01. The unused buffer 37 may be a CMOS transistor.

As shown in FIG. 12B, the unused buffer 37 can be regarded as an equivalent to resistors R01 and R02 and switches SW01 and SW02. In other words, when the unused buffer 37 outputs an H level, the P-channel MOS transistor P01 turns on, and when an L level is outputted, the N-channel MOS transistor N01 turns on. These two switches SW01 and SW02 complementarily repeats turning on and off. Switching between on and off as described is the operation of the output buffers 32 to 36.

However, since the unused buffer 37 is not connected to the semiconductor device 40, it is possible to fix its output. Therefore, the output of the unused buffer 37 is maintained at H level. Then, since the P-channel MOS transistor P01 can be regarded as an equivalent to resistance, a decoupling circuit in which a capacitor is connected to the unused buffer 37 becomes equivalent to the RC circuit shown in FIG. 8C.

The on-resistance of the output buffers used in the die 30 is usually between several ohms and several tens of ohms. Further, the on-resistance of a transistor depends on its drive capability; the higher the drive capability, the lower the on-resistance. Further, when the frequency response of the RC circuit in FIG. 11 is taken into consideration, the on-resistance is preferably between several hundreds of milliohms and several ohms. Since a user is able to set drive capability with an FPGA (Field Programmable Gate Array), such a value of on-resistance can be obtained by setting the drive capability as high as possible. Further, when there are a plurality of unused buffers, the on-resistance described above can be obtained by utilizing them as well.

In the present exemplary embodiment, the decoupling circuit in which an end of the capacitor 38 is grounded and the P-channel MOS transistor included in the output buffer is put in an ON state was described. However, the configuration of the decoupling circuit that realizes the reduction of the internal impedance is not limited to the above content.

Figure 13:
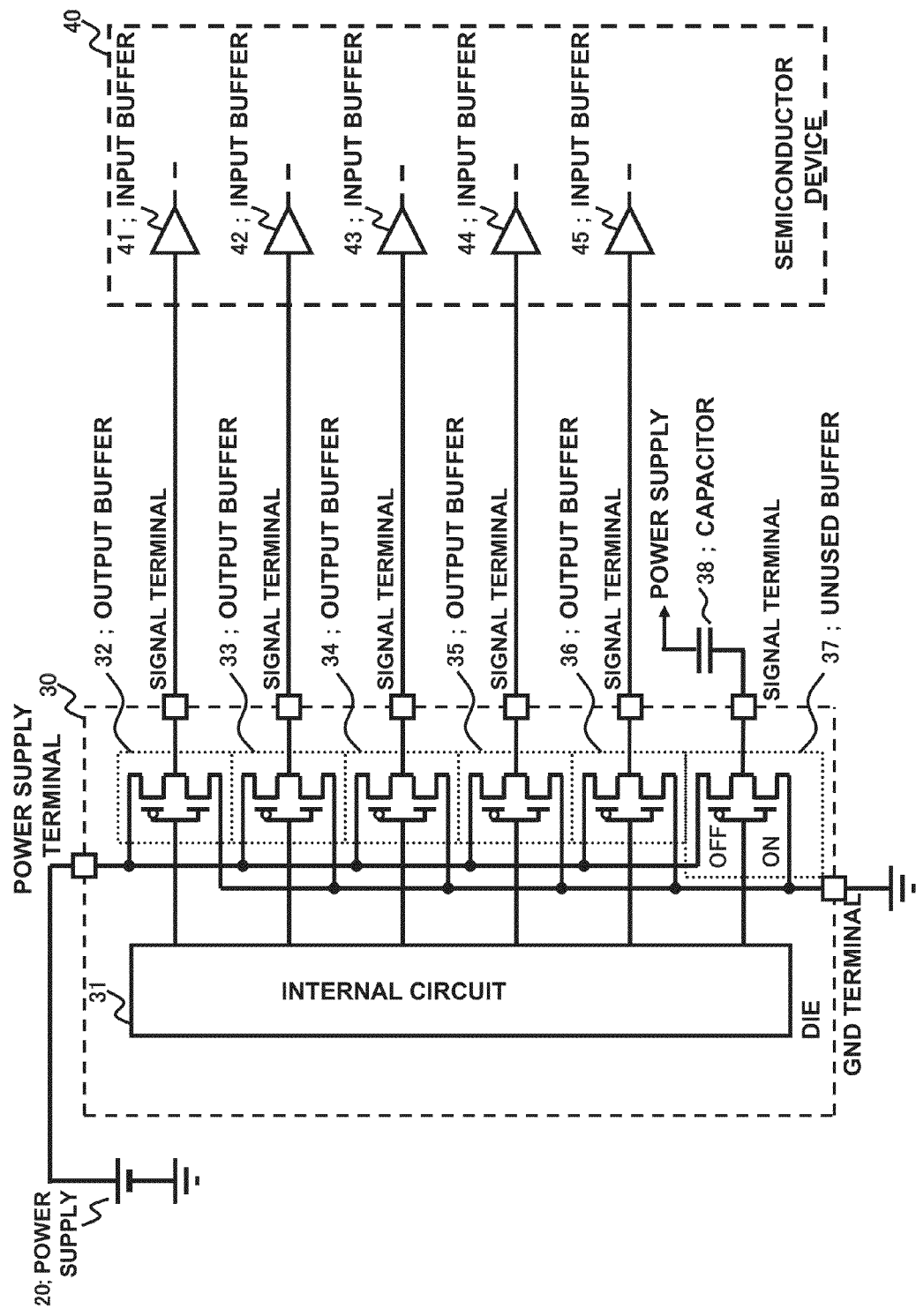
FIG. 13 is a drawing showing another example of a circuit configuration of the die 30 in the semiconductor integrated circuit relating to the first exemplary embodiment.

FIG. 13 is a drawing showing an example of a circuit configuration of the die 30 in the semiconductor integrated circuit relating to the present exemplary embodiment. As shown in FIG. 13, the same effect can be obtained by connecting the capacitor 38 to the power supply, and putting the N-channel MOS transistor included in the unused buffer 37 in an ON state. In other words, the output buffer is formed of a MOS transistor of a first conductivity type and a MOS transistor of a second conductivity type, and which transistor should be put in an ON state is determined by whether the capacitor 38 is connected to the power supply voltage or the ground voltage. More concretely, when the MOS transistor of the first conductivity type is a P-channel MOS transistor, the MOS transistor of the second conductivity type is an N-channel MOS transistor, and the capacitor 38 is connected to the ground voltage, the P-channel MOS transistor is put in an ON state. Meanwhile, when the capacitor 38 is connected to the power supply voltage, the N-channel MOS transistor is put in an ON state.

Figure 14:
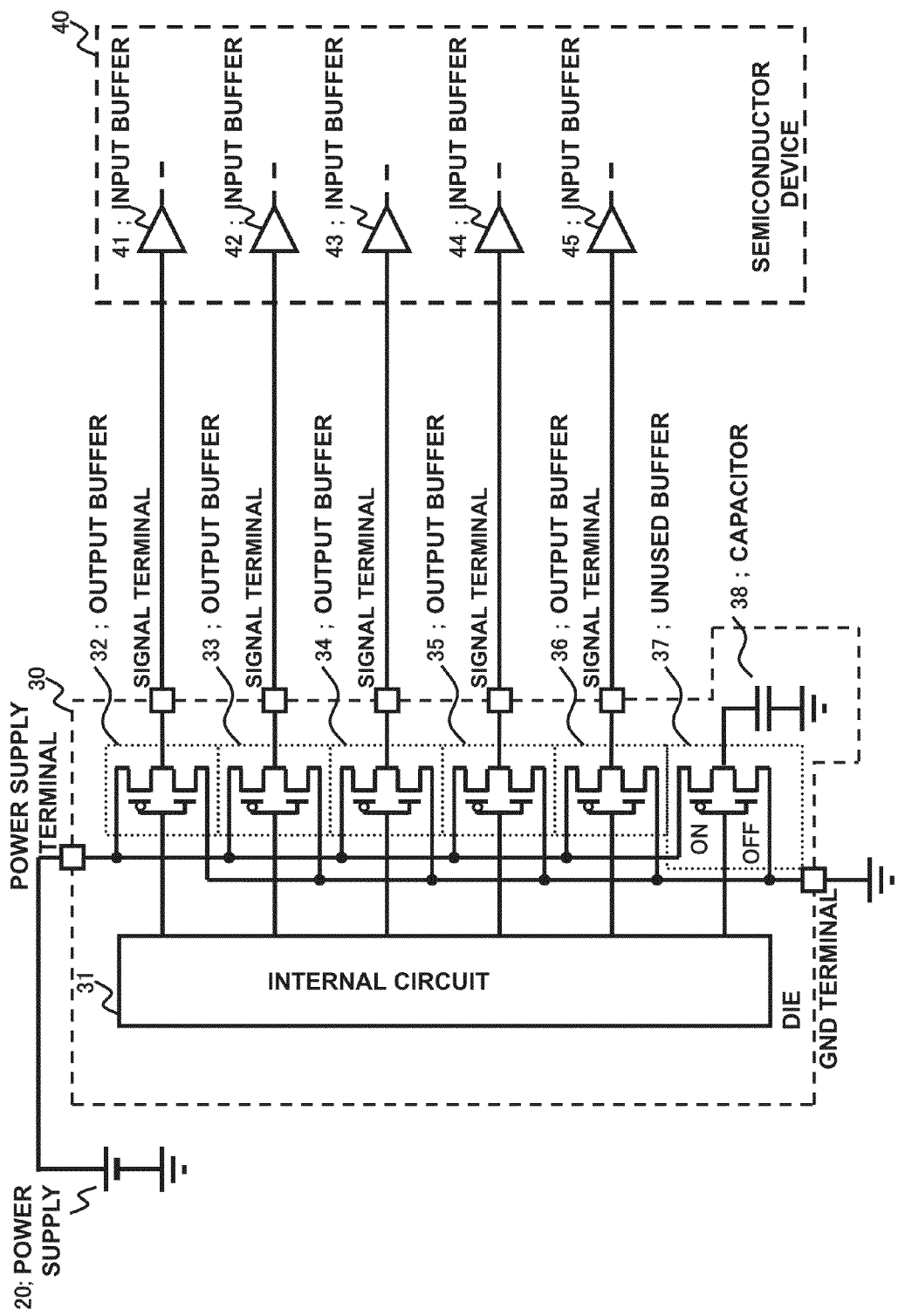
FIG. 14 is a drawing showing another example of a circuit configuration of the die 30 in the semiconductor integrated circuit relating to the first exemplary embodiment.

FIG. 14 is a drawing showing an example of a circuit configuration of the die 30 in the semiconductor integrated circuit relating to the present exemplary embodiment. As shown in FIG. 14, it is possible to provide the capacitor 38 in the die 30. In this case, there is a benefit that providing the decoupling circuit in the interposer of the die 30 eliminates the necessity to provide a capacitor on the printed circuit board.

Further, instead of using an output buffer comprised of a P-channel MOS transistor and an N-channel MOS transistor as described, an unused P-channel MOS transistor or N-channel MOS transistor may be used.

Figure 15:
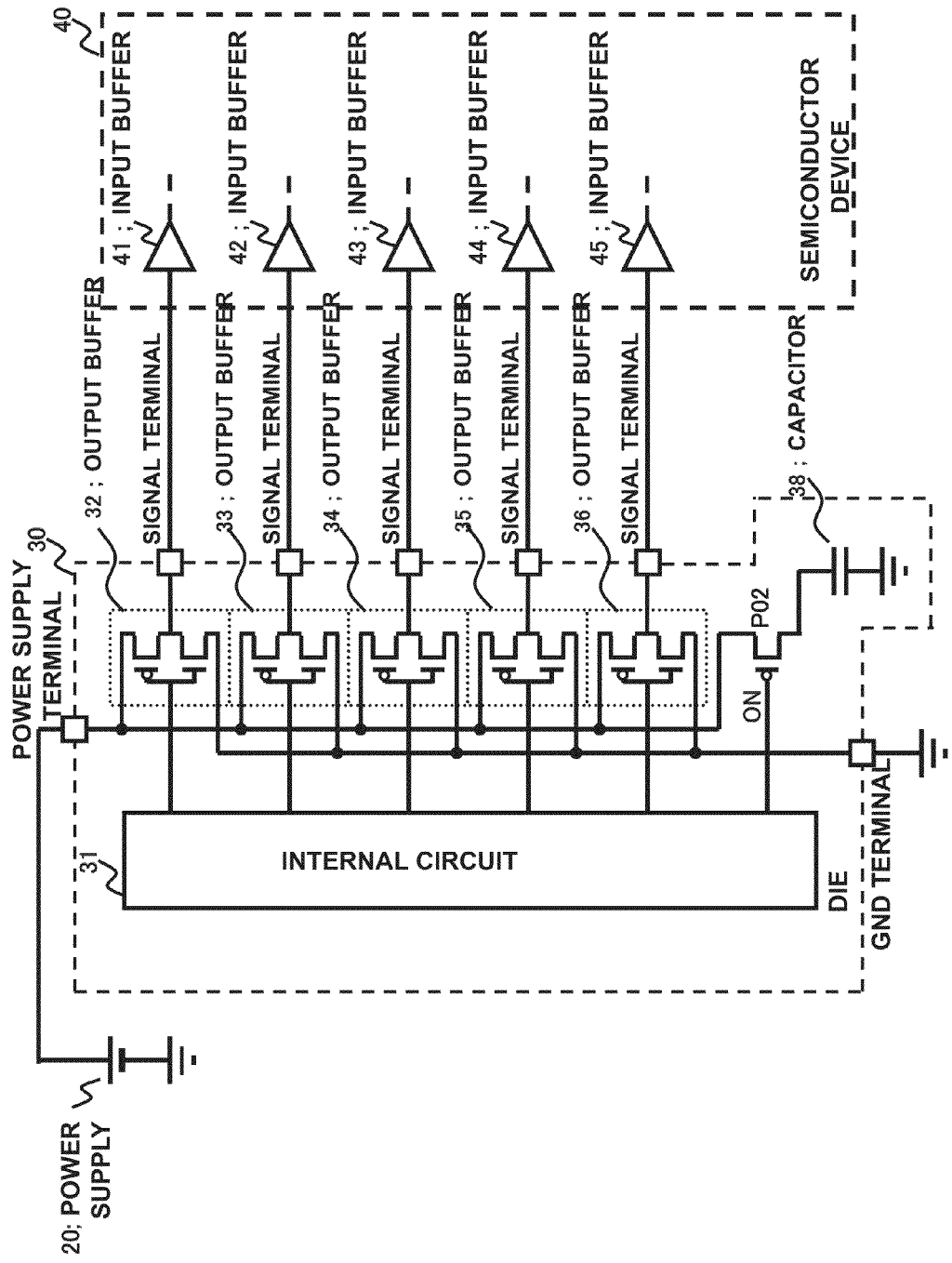
FIG. 15 is a drawing showing another example of a circuit configuration of the die 30 in the semiconductor integrated circuit relating to the first exemplary embodiment.
Figure 16:
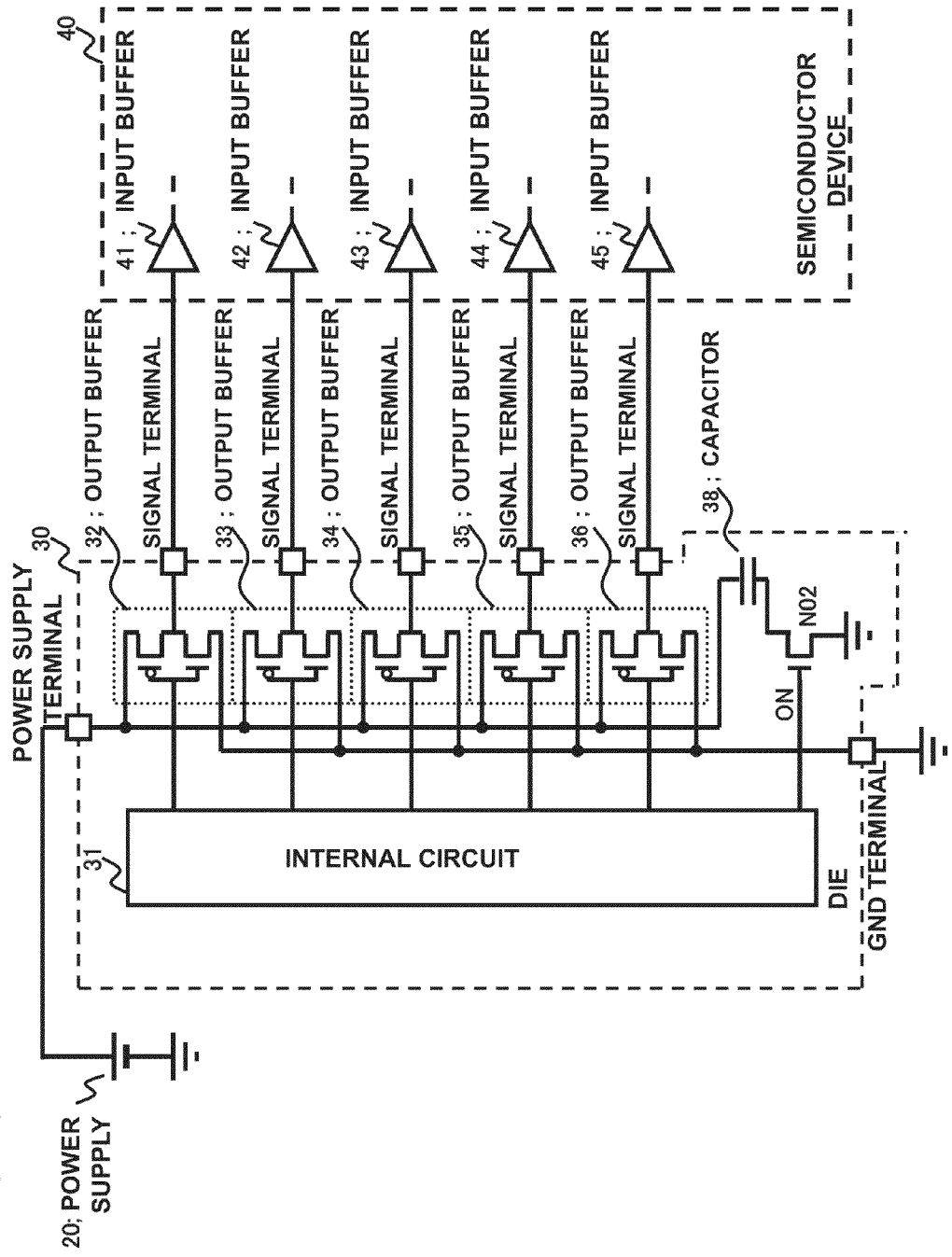
FIG. 16 is a drawing showing another example of a circuit configuration of the die 30 in the semiconductor integrated circuit relating to the first exemplary embodiment.

FIG. 15 is an example in which a decoupling circuit is formed of using an unused P-channel MOS transistor. FIG. 16 is an example in which a decoupling circuit is formed of using an unused N-channel MOS transistor. It is possible to have the unused transistors shown in FIGS. 15 and 16 output an H level or L level by applying an appropriate voltage to a gate thereof, and these transistor can be regarded as output buffers. In FIGS. 13 to 16, the same signs are given to the components same as those in FIG. 6, and the explanation will be omitted.

As described, by connecting a capacitor to an unused buffer out of output buffers included in a semiconductor integrated circuit and fixing an output level of the unused buffer, the internal impedance of the semiconductor integrated circuit can be reduced. This is because the RC circuit shown in FIG. 8C can be formed of the on-resistance of a transistor constituting the output buffer and the capacitor. Decreasing the internal impedance of the semiconductor integrated circuit reduces noise occurring in the semiconductor integrated circuit, contributing to quality improvement.

Further, since a decoupling circuit can be formed of utilizing an unused buffer not connected to another semiconductor integrated circuit, the chip size of the semiconductor integrated circuit does not increase. Further, the fact that the chip size does not increase contributes to reducing the cost of the semiconductor integrated circuit.

Figure 17:
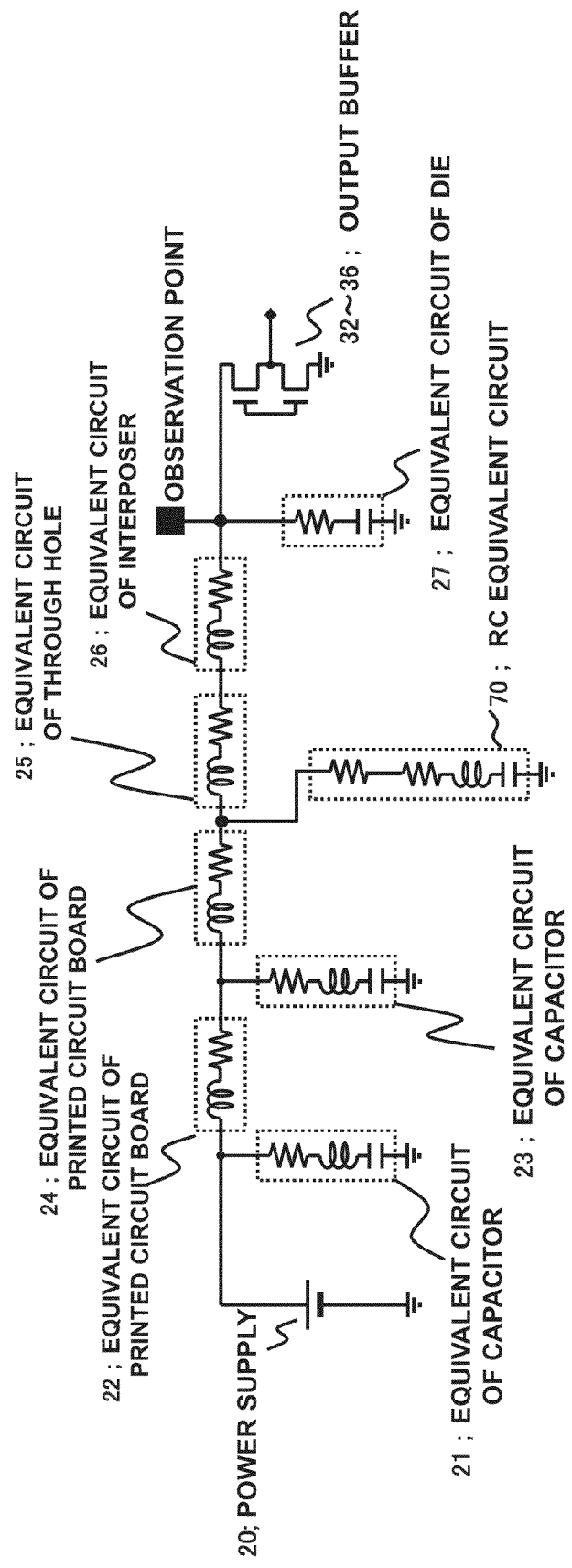
FIG. 17 is a drawing showing an example of an equivalent circuit when an RC circuit is added to a semiconductor integrated circuit.
Figure 18:
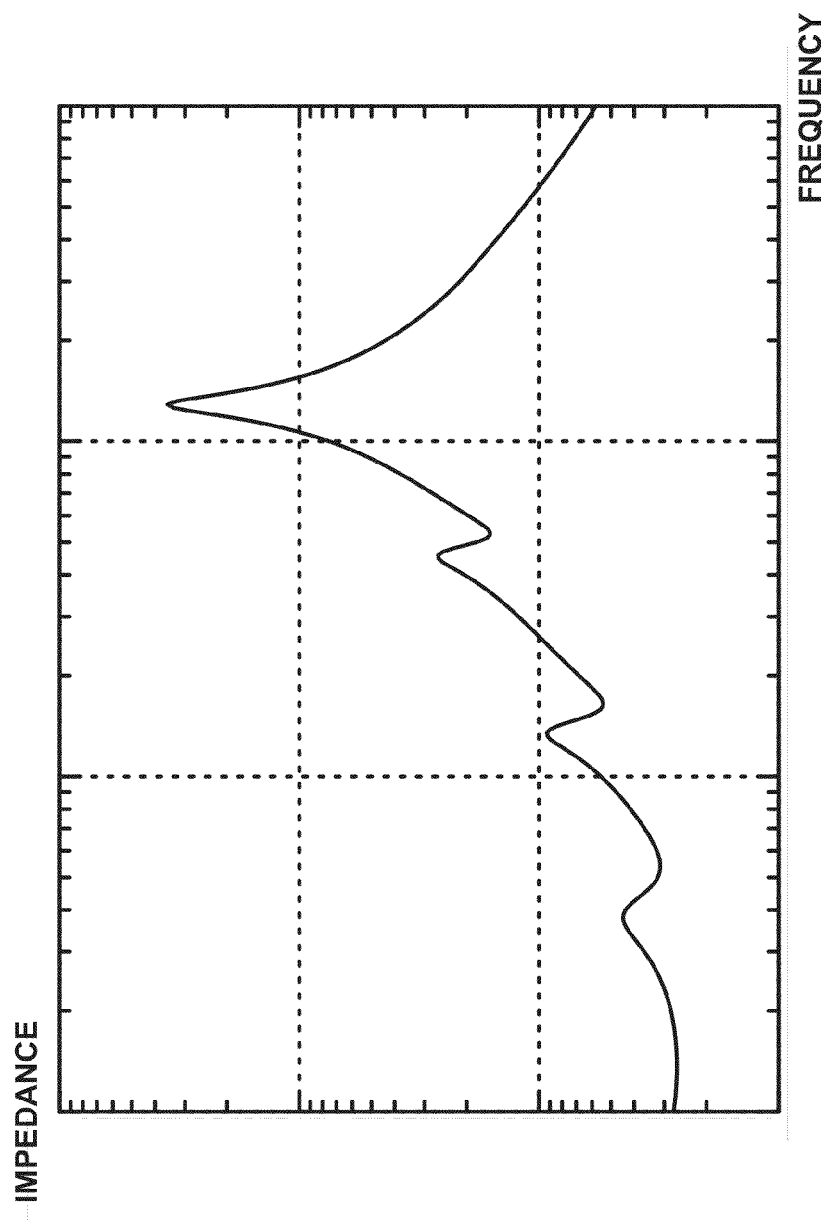
FIG. 18 is drawing showing an example of impedance calculation for the equivalent circuit shown in FIG. 17.

Here, one may think of an idea that a resistor corresponding to the on-resistance of a transistor and the capacitor 38 can be connected inside the semiconductor integrated circuit. An equivalent circuit in this case is shown in FIG. 17. In FIG. 17, the same signs are given to the components same as those in FIG. 6, and the explanation will be omitted. Further, FIG. 18 shows an example of calculating the impedance of the equivalent circuit shown in FIG. 17. FIG. 18 indicates that the peak frequency has moved, but does not indicate any impedance reduction. The reason why the impedance is not reduced may be that the added RC circuit has lost the effect of reducing the impedance due to the influences from the printed circuit board and surrounding capacitors. However, the transistors included in the output buffers are usually disposed on the periphery of the semiconductor integrated circuit (die), and such influences from the printed circuit board and surrounding capacitors are considered to be insignificant.

In other words, it is difficult to reduce the internal impedance of a semiconductor integrated circuit simply by providing a capacitor outside the semiconductor integrated circuit as shown in FIG. 17 due to the influences from through holes on the printed circuit board and inductors of solder balls. Meanwhile, by providing the capacitor through an output buffer, the interposer for the signal line and the inductors such as the solder balls are connected in parallel to the impedance of the power supply line. Due to the fact that the impedance is connected in parallel, the impedance of the interposer for the signal line and the solder balls is reduced and does not significantly inhibit the effect of reducing the internal impedance in the semiconductor integrated circuit.

The decoupling circuit and the semiconductor integrated circuit described in the present exemplary embodiment can be applied to electronic circuits such as a communication device and information processing device.

Further, each disclosure of Patent Literatures listed above is incorporated herein by reference thereto. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned. For instance, it is possible to constitute a decoupling circuit using a bidirectional buffer instead of an output buffer. The ranges of the numerical values used in the present document should be interpreted as specific numeric values or small ranges included in the ranges even in cases where it is not stated so.

REFERENCE SIGNS LIST

10: printed circuit board
11: interposer
12, 30: die
13: pad
14: power line
15: ground line
16, 17: solder ball
18, 19: decoupling capacitor
20: power supply
21, 23: equivalent circuit of the decoupling capacitor
22, 24: equivalent circuit of the printed circuit board
25, 52: equivalent circuit of the through hole
26, 51: equivalent circuit of the interposer
27: equivalent circuit of the die
28, 32 to 36, 200: output buffer
31: internal circuit
37: unused buffer
38, 300: capacitor
40: semiconductor device
41 to 45: input buffer
50: equivalent circuit of the on-resistance of a P-channel MOS transistor
53, 62: equivalent circuit of a capacitor
60: bypass capacitor equivalent circuit
61: die equivalent circuit
63, 70: equivalent circuit of an RC circuit
100: decoupling circuit
N01, N02: N-channel MOS transistor
P01, P02: P-channel MOS transistor
R01, R02: on-resistance of a transistor
SW01, SW02: switch

What is claimed is:

1. A decoupling circuit, comprising:
   an output buffer that includes a transistor; and
   a capacitor that has an end thereof connected to an output node of the output buffer and the other end thereof connected to a power supply line, wherein
   a logic level outputted by the output node of the output buffer is fixed.

2. The decoupling circuit according to claim 1, wherein the transistor is formed of a MOS transistor of a first conductivity type and wherein the output buffer includes another transistor formed of a MOS transistor of a second conductivity type.

3. The decoupling circuit according to claim 2, wherein the MOS transistor of the first conductivity type is a P-channel MOS transistor, the MOS transistor of the second conductivity type is an N-channel MOS transistor, the P-channel MOS transistor is put in an ON state when the capacitor is connected to a ground voltage, and the N-channel MOS transistor is put in an ON state when the capacitor is connected to a power supply voltage.

4. A semiconductor integrated circuit, comprising:
   a plurality of output buffers that include a transistor; and
   a capacitor that has an end thereof connected to an output node of an unused buffer that does not contribute to an operation of transmitting a signal to outside among the plurality of output buffers, and the other end thereof connected to a power supply line, wherein
   a logic level outputted by the output node of the unused buffer is fixed.

* * * * *